United States Patent [19]

Thompson et al.

[11] Patent Number: 4,628,409
[45] Date of Patent: Dec. 9, 1986

[54] PRINTED CIRCUIT BOARDS

[75] Inventors: Gordon L. Thompson, Cheadle; Brian Gudgeon, Rossendale; Kenneth J. Wombwell, Stockport, all of Great Britain

[73] Assignee: International Computers Limited, London, England

[21] Appl. No.: 829,239

[22] Filed: Feb. 14, 1986

Related U.S. Application Data

[63] Continuation of Ser. No. 636,618, Aug. 1, 1984, abandoned.

[30] Foreign Application Priority Data

Aug. 20, 1983 [GB] United Kingdom ............... 8322473

[51] Int. Cl.$^4$ ............................................. H05K 1/18
[52] U.S. Cl. .................................. 361/403; 228/180.1; 228/180.2; 361/400; 361/406; 361/411; 427/259
[58] Field of Search ............... 361/400, 401, 403, 406, 361/408, 410, 411, 414; 228/39, 119, 180.1, 180.2; 427/259

[56] References Cited

U.S. PATENT DOCUMENTS

| 2,854,552 | 9/1958 | Gouverneur | 361/401 X |
| 2,916,805 | 12/1959 | Plesser | 361/411 X |
| 3,346,689 | 10/1967 | Parstorfer | 361/411 X |
| 3,431,350 | 3/1969 | Haberbrecht | 361/400 X |
| 3,745,513 | 7/1973 | Gross | 361/408 X |
| 4,051,550 | 9/1977 | Seno et al. | 361/411 X |
| 4,139,881 | 2/1979 | Shimizu et al. | 361/400 |
| 4,288,840 | 9/1981 | Konishikawa et al. | 361/410 |
| 4,372,475 | 2/1983 | Goforth | 361/402 X |
| 4,413,309 | 11/1983 | Takaahashi et al. | 361/400 X |

Primary Examiner—R. R. Kucia
Attorney, Agent, or Firm—Lee, Smith & Zickert

[57] ABSTRACT

A printed circuit board which facilitates the removal and replacement of components. The circuit board (1) has unplated holes (8) extending therethrough for receiving connection pins (3) of components (2) mounted on one face of the circuit board (1). The pins (3) protrude from the opposite face of the circuit board (1) and are soldered to conductive pads (9) on this face which are connected by surface conductors (10) to plated through-holes (4) linking conductive tracks (6,7) at different layers of the circuit board (1).

3 Claims, 3 Drawing Figures

PRINTED CIRCUIT BOARDS

This application is a continuation of U.S. patent application Ser. No. 636,618, filed Aug. 1, 1984, and now abandoned.

BACKGROUND OF THE INVENTION

This invention relates to printed circuit boards, and especially to printed circuit boards which facilitate the removal and replacement of components.

It is common to mount complex electronic components on printed circuit boards by inserting pins of the components into plated through-holes of the circuit and soldering them in place. The plated through-holes normally provide connections between the pins and conductive material forming part of the circuit and situated at different levels of the board.

If it is necessary to remove a component, for example to replace it because it is faulty, it is found that the heat used to melt the solder tends to cause the board to expand and damage the circuitry of the board. The problem is especially serious with modern very-large-scale integrated-circuit components mounted in so-called pin grid array packages. The large number of densely packed pins in such an array (typically above 100) requires the solder for all the pins to be melted simultaneously if the process is not to be inconveniently long. The great amount of heat that is therefore applied, and the relatively great thickness of the board which is needed to provide the large number of interconnections required, then exacerbate the expansion problem and hence the damage to the board. Yet, because those components are expensive, it is all the more desirable to repair a board rather than to discard it. It has indeed been suggested that the only solution to the problem is to use sockets, which are soldered into the board. The components are then plugged into the sockets, but this method increases both the cost and bulk of the board and reduces its reliability and electrical performance.

SUMMARY OF THE INVENTION

This invention provides a printed circuit board for mounting components thereon including; a plurality of first and a plurality of second holes extending through the circuit board, each first hole being a through-hole for the reception of a component connection pin and without internal plating and each second hole being a plated through-hole connected to conductive tracks at different levels of the circuit board;

a surface pad of conductive material adjacent each first hole at a first face of the circuit board, each pad being suitable for forming part of a soldered connection with a component pin inserted in the hole and said surface pads being connected to respective surface conductors, at least some of which conductors are connected to the internal plating of a second hole.

A printed circuit board according to the invention may have at least one component, situated on a second face of the board remote from the said first face and having a plurality of connection pins each inserted into a first hole and soldered at said first face to the surface pad adjacent to that first hole.

It is found that the solder connections of a component can be melted quickly and simultaneously with a much reduced risk of damage to the circuitry of the board. Yet a complex circuit can be provided because the second, plated, holes provide connections to more than one conductive layer. Preferably the board is multilayer, by which is meant herein that there is at least one conductive layer in the interior of the board providing a connection or connections of the printed circuit.

Preferably the second holes are provided with means at the first face to prevent entry of molten solder. That avoids the risk of solder entering the second holes and, on being melted, causing expansion of the board and damage to the circuitry. A coating of solder resist is a suitable such means.

It is common to use epoxy-glass as the insulating material for a printed circuit board. However epoxy-glass softens at the melting temperature of normal solders and conductive material carried by it. There is therefore 9 that reduces the adhesion between the epoxy-glass and the risk that a pad, such as that adjacent to a first hole, which is not anchored by plating of a through-hole, will lift when the solder is melted. We therefore prefer the material of the board carrying the said pads to be polyimide-glass or other material having a good adhesion to the material of the pads at the melting temperature of normal tin/lead solders.

Polyimide-glass is more expensive than epoxy-glass and requires higher bonding temperatures. We therefore find it advantageous for the board to be a composite board comprising a laminate of epoxy-glass, with an outer layer of polyimide-glass, the two being separated by a conductive layer that is a substantially complete plane, (e.g. a voltage plane). This construction reduces the cost and also avoids the need to rely on a polyimide-glass/epoxy-glass joint to any substantial extent. Preferably the polyimide-glass is pre-cured and clad on one face with the conductive material forming the said plane and is then bonded with that face inwards to a stack the insulating material of which is epoxy-glass, the bond being formed by completing the cure of a partially cured epoxy-glass sheet.

BRIEF DESCRIPTION OF THE DRAWINGS

A printed circuit board constructed in accordance with the invention will now be described in greater detail, by way of example, with reference to the accompanying drawing, in which.

DESCRIPTION OF THE PREFERRED EMBODIMENT

Figure 1:
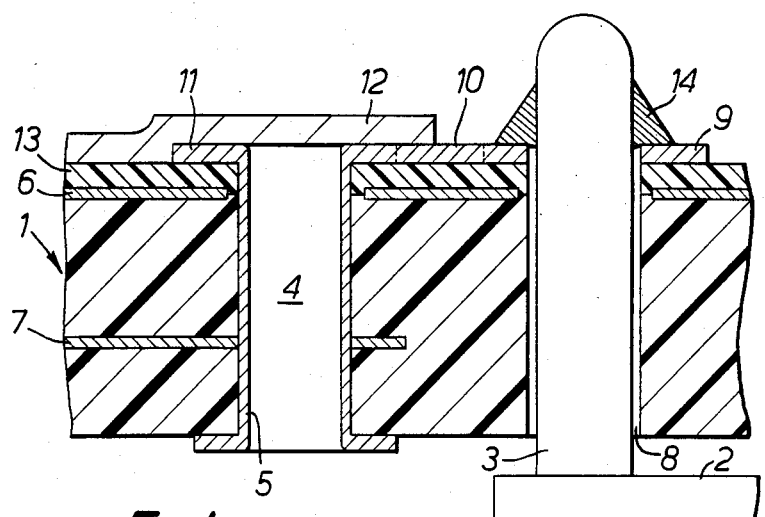
FIG. 1 is a section through a part of the board, also showing a part of a mounted component.
Figure 2:
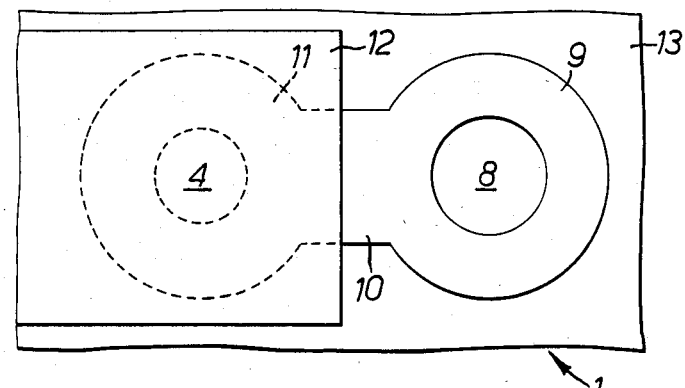
FIG. 2 is a plan view (without the component) of the part of the board shown in FIG. 1 as seen from above.

Referring to FIGS. 1 and 2, the board, indicated generally by the reference numeral 1, is shown carrying a component 2. The component 2 is a pin grid array package having a large number of pins (e.g. 135 or 179) of which only one pin 3 is shown.

The board 1 is a multilayer board (not all the layers being shown) and contains, as is well known, conductive material in internal layers inter- connected by plated through-holes. One such hole, a hole 4 is shown, having plating 5. The internal layers may be voltage (i.e. earth or power) planes or signal planes. A plane 6 is an example of a voltage plane, which consists of a substantially uniform layer of conductive material that makes contact with some through-holes but is perforated to allow others to pass through it without making contact. The signal planes contain various conductive tracks, such as track 7 shown as an example making contact with the plating 5 of the hole 4. It will be realised that many other layers will be provided for a board that carries pin-grid array packages.

Plated through-holes, such as the hole 4, do not carry pins of a component. Instead such pins are carried by holes such as a hole 8 shown carrying the pins 3. These holes are free of plating on their internal walls.

The mouth of the hole 8 at the face of the board 1 remote from the component 2 is surrounded by a pad 9. The pad 9 is connected by a surface track 10 to a pad 11, surrounding the mouth of the hole 4 and connected to its plating 5. In this embodiment each other non-plated hole is similarly linked to a plated through-hole.

A layer 12 of solder resist is applied to cap all the plated through-holes but leaves the pad 9 and all other pads round non-plated holes exposed.

The bulk of the board is constructed from epoxy-glass in which are situated the conductive layers. The boundary of the epoxy-glass is the voltage plane 6, on the other side of which is a layer of polyimide-glass 13.

To mount a component, its pins are inserted in the non-plated holes and the face containing the pad 9 and similar pads is moved relative to a tin/lead solder wave, which leaves a fillet 14 of solder connecting the pad 9 to the pin 3 and similarly connects the other pins to the board. Solder does not enter non-plated holes to any appreciable extent and is kept out of plated through-holes by the solder resist 12, which also acts as a thermal barrier.

If it is then desired to remove a component the board is suspended above a tin-lead solder wave, the solder of all the pins of the component melted and the component removed. After the component has been removed any solder bridging the holes is gently blown away before it has solidified using air, which may be warmed. With the holes thus cleared a replacement component may then be inserted and soldered in place. If required the component at a given position may be changed a number of times. It will therefore be realised that economical repair or modification of the board is facilitated.

It is found that a pin grid array package may be unsoldered and removed in three to five seconds and with negligible damage to the board. This may be compared with the situation when the pins of the package are soldered in plated through-holes of a board that is constructed using epoxy-glass as the dielectric throughout. It is then found that it takes some 10 seconds to melt the solder, and even if the solder of each pin is melted individually and removed by suction it is found that damage occurs at a considerable number of holes. The damage consists usually of pads lifting round their peripheries and possibly of the joints between internal conductive layers and the hole plating fracturing. It occurs because the length of time the board is exposed to the temperature of molten tin-lead solder (220° C. to 250° C.) coupled with the efficient path for conduction of heat afforded by the solder in the holes results in the temperature of the epoxy-glass material in the interior of the board rising above its transition temperature of 120° C. Above this temperature its rate of expansion rises rapidly and the expansion of the epoxy-glass material in the direction across the board is greater than the expansion of the conductive material. At the same time the adhesion between the conductive material (normally copper) and the epoxy-glass material is much reduced.

The function of the polyimide-glass layer 13 will now be explained. Polyimide-glass material has a transition temperature of 260° C. to 280° C. It therefore suffers minimal loss of adhesion to pads at the temperature of 220° to 250° of the solder wave, and the pads have good adhesion to the polyimide-glass layer. Consequently they do not lift to any appreciable extent even though they no longer have the anchorage previously provided by the internal plating. However, the bulk of the board is of epoxy-glass, which is cheaper than polyimide-glass and thus reduces the total cost of the board.

Copper-clad polyimide-glass laminate is available as a commercial item. This allows the board of FIG. 1 to be manufactured in a simple manner. The necessary epoxy-glass laminates are prepared in the conventional manner used for the manufacture of multilayer boards. Similarly a polyimide-glass laminate is given the pattern of the voltage plane 6. These laminates are assembled in a stack with the polyimide-glass laminate as one outer layer and having the plane 6 facing inwards. The laminates are interleaved with sheets of pre-preg (partially cured epoxy-glass) and the whole bonded together by heating to complete the cure, which requires only the lower temperatures and shorter times appropriate to epoxy-glass rather than those required for polyimide-glass. It should be noted that the plane 6 is thus bonded to one of the sheets of pre-preg and no substantial regions of epoxy-glass and polyimide-glass are in contact, thus overcoming problems which can occur if joints between these materials must be relied on. Outer conductive patterns are then defined and holes to be plated are drilled. The board is then plated, following which non-plated holes are drilled and solder resist applied.

Figure 3:
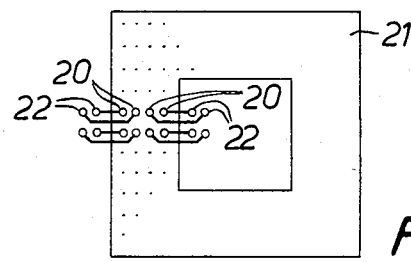
FIG. 3 is a diagram showing the dispositions of holes in a region of a board associated with an individual component.

FIG. 3 illustrates one possible disposition of holes for a pin grid array package having pins arranged in four concentric squares. Non-plated holes 20 for these pins similar to the hole 8 are in a region 21. Each of these holes is linked to an associated through-hole 22 similar to the hole 4 and either inside or outside the region 21. It will be appreciated that only a few of the holes have been shown in FIG. 3. We prefer to connect each non-plated hole by a link to a plated through-hole in the interests of systematic design, but if desired tracks may run straight from one non-plated hole (i.e. pin) to another, for example on another component or an edge connector.

As examples of suitable dimensions the board may be 0.114 inches (2.896 mm) thick, the polyimide layer 0.005 inches (0.127 mm) thick, conductive layers 0.0014 inches (0.0356 mm) thick and the solder resist 0.002 to 0.003 inches (0.0508 to 0.0762 mm) thick. The pins may project 0.040 to 0.080 inches (1.016 to 2.032 mm) beyond the surface of the board.

While the solder resist/thermal barrier gives added protection to the board integrity it may be omitted for applications where the reliability of the connections inside the hole is not at a premium.

While the use of a polyimide-glass outer layer is preferred because it gives added protection against damage, the short time required to melt the solder and the absence of solder in the holes in the method described in itself gives a substantial improvement in reliability even if the dielectric is epoxy-glass throughout.

We claim:

1. A multilayer printed circuit board including a plurality of internal conductive layers comprising conductive tracks; a plurality of unplated holes extending through the circuit board; a plurality of plated through-holes extending through the circuit board and being connected to selected ones of said conductive tracks of different layers; a surface pad of conductive material adjacent each unplated hole at a first face of the circuit board; surface conductors on said first face connecting at least some of the surface pads directly to plated through holes; at least one component having connection pins, each pin extending into an unplated hole and being soldered to its adjacent surface pad; and a layer of solder resist material extending over the plated through-holes at said first face.

2. A printed circuit board as claimed in claim 1 in which said first face of the circuit board comprises a polyimide-glass layer.

3. A multilayer printed circuit board as claimed in claim 1 in which said component is situated on a second face of the circuit board opposite said first face and its connection pins extend through the unplated holes to the surface pads on the first face.

* * * * *